United States Patent
Shang

(10) Patent No.: US 11,995,341 B2
(45) Date of Patent: May 28, 2024

(54) READ/WRITE SWITCHING CIRCUIT AND MEMORY

(71) Applicant: CHANGXIN MEMORY TECHNOLOGIES, INC., Hefei (CN)

(72) Inventor: Weibing Shang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 143 days.

(21) Appl. No.: 17/595,721

(22) PCT Filed: Mar. 1, 2021

(86) PCT No.: PCT/CN2021/078506
§ 371 (c)(1),
(2) Date: Nov. 23, 2021

(87) PCT Pub. No.: WO2021/244080
PCT Pub. Date: Dec. 9, 2021

(65) Prior Publication Data
US 2022/0413744 A1    Dec. 29, 2022

(30) Foreign Application Priority Data
Jun. 5, 2020    (CN) .......................... 202010504964.5

(51) Int. Cl.
*G11C 7/10*    (2006.01)
*G06F 3/06*    (2006.01)
(Continued)

(52) U.S. Cl.
CPC .......... *G06F 3/0655* (2013.01); *G06F 3/0604* (2013.01); *G06F 3/0679* (2013.01);
(Continued)

(58) Field of Classification Search
CPC ... G11C 7/1048; G11C 7/1051; G11C 7/1078; G11C 7/1087; G11C 7/1096;
(Continued)

(56) References Cited

U.S. PATENT DOCUMENTS 5,291,447 A * 3/1994 Kodama ................. G11C 7/065
365/207
5,355,349 A * 10/1994 Sakata ................... G11C 11/419
365/233.5
(Continued)

FOREIGN PATENT DOCUMENTS

| CN | 1233839 A | 11/1999 |
|---|---|---|
| CN | 1450559 A | 10/2003 |

(Continued)

OTHER PUBLICATIONS

International Search Report as cited in PCT Application No. PCT/CN2021/078506 dated Jun. 2, 2021, 5 pages.
(Continued)

*Primary Examiner* — Khamdan N. Alrobaie
(74) *Attorney, Agent, or Firm* — Cooper Legal Group, LLC

(57) ABSTRACT

A read/write switching circuit and a memory are provided. The read/write switching circuit includes: a first data line (Ldat) connected to a bit line (BL) through a column select module, a first complementary data line (Ldat #) connected to a complementary bit line through the column select module, a second data line (Gdat) and a second complementary data line (Gdat #), and further includes: a read/write switching module (101) configured to transmit data between the first data line and the second data line and transmit data between the first complementary data line (Ldat #) and the second complementary data line (Gdat #) during read and write operations in response to read and write control signals; and an amplification module (102) connected
(Continued)

between the first data line (Ldat) and the first complementary data line (Ldat #) and configured to amplify data of the first data line (Ldat) and data of the first complementary data line (Ldat #).

18 Claims, 6 Drawing Sheets

(51) Int. Cl.
  *G11C 7/22* (2006.01)
  *G11C 11/409* (2006.01)
  *G11C 11/4091* (2006.01)
  *G11C 11/419* (2006.01)
  *G11C 13/00* (2006.01)

(52) U.S. Cl.
  CPC .......... *G11C 7/1048* (2013.01); *G11C 7/1051* (2013.01); *G11C 7/1078* (2013.01); *G11C 7/1087* (2013.01); *G11C 7/1096* (2013.01); *G11C 7/222* (2013.01); *G11C 11/409* (2013.01); *G11C 11/4091* (2013.01); *G11C 11/419* (2013.01); *G11C 2013/0042* (2013.01)

(58) Field of Classification Search
  CPC ... G11C 7/222; G11C 11/409; G11C 11/4091; G11C 11/419; G11C 2013/0042; G06F 3/0655; G06F 3/0604; G06F 3/0679; G06F 3/061; G06F 3/0658
  See application file for complete search history.

(56) References Cited

U.S. PATENT DOCUMENTS

| | | | | |
|---|---|---|---|---|
| 6,249,476 | B1* | 6/2001 | Yamazaki | ........... G11C 11/4097 365/230.06 |
| 6,359,803 | B1 | 3/2002 | Tanaka | |
| 7,289,385 | B2 | 10/2007 | Kwak | |
| 8,279,695 | B2* | 10/2012 | Takahashi | ............... G11C 7/227 365/205 |
| 2004/0090817 | A1* | 5/2004 | Christensen | ............. G11C 7/18 365/154 |
| 2005/0018511 | A1 | 1/2005 | Lee | |
| 2006/0056229 | A1* | 3/2006 | Maeda | ................... G11C 11/412 365/154 |
| 2006/0268594 | A1 | 11/2006 | Toda | |
| 2007/0070758 | A1 | 3/2007 | Graf et al. | |
| 2007/0230262 | A1 | 10/2007 | Origasa | |
| 2008/0117698 | A1 | 5/2008 | Hsu | |
| 2009/0141568 | A1 | 6/2009 | Kengeri | |
| 2010/0165702 | A1 | 7/2010 | Toda | |
| 2011/0019462 | A1 | 1/2011 | Toda | |
| 2011/0199835 | A1 | 8/2011 | Kengeri | |
| 2011/0211407 | A1* | 9/2011 | Chou | ........................ G11C 7/12 365/207 |
| 2012/0099365 | A1 | 4/2012 | Toda | |
| 2013/0141992 | A1* | 6/2013 | Lee | ........................... G11C 7/18 365/189.011 |
| 2020/0005841 | A1 | 1/2020 | Tsai et al. | |
| 2021/0043239 | A1 | 2/2021 | Tsai et al. | |
| 2022/0189541 | A1* | 6/2022 | Yang | ..................... G11C 11/418 |

FOREIGN PATENT DOCUMENTS

| | | |
|---|---|---|
| CN | 1637947 A | 7/2005 |
| CN | 1937072 A | 3/2007 |
| CN | 102024491 A | 4/2011 |
| CN | 212032139 U | 11/2020 |

OTHER PUBLICATIONS

Jinyeong Moon and Byongtae Chung, "Sense Amplifier with Offset Mismatch Calibration for Sub 1-V DRAM Core Operation", Published in: 2010 IEEE International Symposium on Circuits and Systems (ISCAS), Date Added to IEEE Xplore: Aug. 3, 2010, Date of Conference: May 30, 2010-Jun. 2, 2010, Publisher: IEEE, DOI: 10.1109/ISCAS.2010.5537834.p. 3501-p. 3504, 4 pages.

Shunichi Suzuki and Masaki Hirata, "Threshold Difference Compensated Sense Amplifier", Published in: IEEE Journal of Solid-State Circuits ( vol. 14, Issue: 6, Dec. 1979), pp. 1066-1070, Date of Publication: Dec. 1979, DOI: 10.1109/JSSC.1979.1051316, Publisher: IEEE, 5 pages.

Written Opinion cited in PCT/CN2021/078506, dated Jun. 2, 2021, 6 pages.

Supplementary European Search Report in the European application No. 21818325.9, dated Sep. 13, 2022, 11 pages.

First Office Action of the European application No. 21818325.9, dated May 25, 2023. 6 pages.

Oral Proceedings of the European application No. 21818325.9, issued on Nov. 16, 2023. 9 pages.

* cited by examiner

READ/WRITE SWITCHING CIRCUIT AND MEMORY

CROSS-REFERENCE TO RELATED APPLICATIONS

This application cites Chinese Patent Application No. 202010504964.5, entitled "READ/WRITE SWITCHING CIRCUIT AND MEMORY" and filed on Jun. 5, 2020, which is incorporated herein in its entirety by reference.

TECHNICAL FIELD

Embodiments of the present application relate to the field of semiconductor technologies, in particular to a read/write switching circuit and a memory.

BACKGROUND

A dynamic random access memory (DRAM) is a common semiconductor storage device in computers and consists of a large number of repeating storage units. Each storage unit generally includes a capacitor and a transistor. The transistor has a gate connected to a wordline (WL), a drain connected to a bit line (BL), and a source connected to the capacitor. A voltage signal on the WL can control ON or OFF of the transistor, and then, data information stored in the capacitor is read through the WL, or data information is written to the capacitor through the BL for storage.

The DRAM is a double data rate (DDR) DRAM, a graphics double data rate (GDDR) DRAM, or a low power double data rate (LPDDR) DRAM. With the application of the DRAM to more and more fields, for example, the DRAM is increasingly applied to the mobile field, users have increasingly higher requirements on a DRAM speed index.

However, a data transmission speed of the current DRAM during read/write is still in need of improvement.

SUMMARY

Embodiments of the present application provide a read/write switching circuit and a memory, so as to solve the problems of slow data transmission during read and write operations.

In order to solve the above problem, the embodiments of the present application provide a read/write switching circuit, including: a first data line connected to a BL through a column select module, a first complementary data line connected to a complementary BL through the column select module, a second data line and a second complementary data line, and further including: a read/write switching module configured to transmit data between the first data line and the second data line and transmit data between the first complementary data line and the second complementary data line during read and write operations in response to read and write control signals; and an amplification module connected between the first data line and the first complementary data line and configured to amplify data of the first data line and data of the first complementary data line.

Furthermore, the amplification module includes a first inverter, an input terminal of the first inverter being electrically connected to the first data line, and an output terminal of the first inverter being electrically connected to the first complementary data line; and a second inverter, an input terminal of the second inverter being electrically connected to the output terminal of the first inverter and the first complementary data line, and an output terminal of the second inverter being electrically connected to the input terminal of the first inverter and the first data line.

Furthermore, the first inverter includes: a first PMOS transistor and a first NMOS transistor, a gate of the first PMOS transistor being connected to a gate of the first NMOS transistor and serving as the input terminal of the first inverter, a source of the first PMOS transistor being connected to an operating power supply, and a drain of the first PMOS transistor being connected to a drain of the first NMOS transistor and serving as the output terminal of the first inverter.

The second inverter includes: a second PMOS transistor and a second NMOS transistor, a gate of the second PMOS transistor being connected to a gate of the second NMOS transistor and serving as the input terminal of the second inverter, a source of the second PMOS transistor being connected to the operating power supply, and a drain of the second PMOS transistor being connected to a drain of the second NMOS transistor and serving as the output terminal of the second inverter.

Furthermore, a source of the first NMOS transistor is grounded, and a source of the second NMOS transistor is grounded.

Furthermore, the read/write switching module includes: a first read/write unit configured to transmit the data of the first data line to the second data line in response to the read control signal in the read and write control signals, or transmit data of the second data line to the first data line in response to the write control signal in the read and write control signals; and a second read/write unit configured to transmit the data of the first complementary data line to the second complementary data line in response to the read control signal, or transmit data of the second complementary data line to the first complementary data line in response to the write control signal.

Furthermore, the first read/write unit includes: a third NMOS transistor, a fourth NMOS transistor and a fifth NMOS transistor; a gate of the third NMOS transistor receives the write control signal, and the third NMOS transistor is electrically connected to the first data line and the second data line in response to the write control signal; a gate of the fourth NMOS transistor is electrically connected to the first complementary data line, a drain of the fourth NMOS transistor is electrically connected to the second data line, a source of the fourth NMOS transistor is electrically connected to a drain of the fifth NMOS transistor, and a gate of the fifth NMOS transistor receives the read control signal.

Furthermore, the second read/write unit includes: a seventh NMOS transistor, an eighth NMOS transistor and a ninth NMOS transistor; a gate of the seventh NMOS transistor receives the write control signal, and the seventh NMOS transistor is electrically connected to the first complementary data line and the second complementary data line in response to the write control signal; a gate of the eighth NMOS transistor is electrically connected to the first data line, a drain of the eighth NMOS transistor is electrically connected to the second complementary data line, a source of the eighth NMOS transistor is electrically connected to a drain of the ninth NMOS transistor, and a gate of the ninth NMOS transistor receives the read control signal.

Furthermore, the read/write switching circuit further includes: a sixth NMOS transistor, a gate of the sixth NMOS transistor receiving an enable signal, a drain of the sixth NMOS transistor being connected to the first inverter and the second inverter and being further electrically connected to the source of the fifth NMOS transistor, and a source of the sixth NMOS transistor being grounded.

Furthermore, the amplification module further includes: an enable NMOS transistor, a drain of the enable NMOS transistor being electrically connected to the first inverter and the second inverter, a gate of the enable NMOS transistor receiving an enable signal, and a source of the enable NMOS transistor being grounded.

Furthermore, the read/write switching module includes: a read unit configured to transmit the data of the first data line to the second data line and transmit the data of the first complementary data line to the second complementary data line in response to the read control signal in the read and write control signals; and a write unit configured to transmit the data of the second data line to the first data line and transmit the data of the second complementary data line to the first complementary data line in response to the write control signal in the read and write control signals.

Furthermore, the write unit includes: a sixth NMOS transistor, a seventh NMOS transistor and an eighth NMOS transistor; and a gate of the eighth NMOS transistor and a gate of the sixth NMOS transistor receive the write control signal, the eighth NMOS transistor is electrically connected to the first data line and the second data line in response to the write control signal, a gate of the seventh NMOS transistor is electrically connected to the second data line, a drain of the seventh NMOS transistor is electrically connected to the first complementary data line, a source of the seventh NMOS transistor is electrically connected to a drain of the sixth NMOS transistor, and a source of the sixth NMOS transistor is grounded.

Furthermore, the write unit further includes: a third NMOS transistor, a fourth NMOS transistor and a fifth NMOS transistor; and gates of the third NMOS transistor and the fifth NMOS transistor receive the write control signal, the third NMOS transistor is electrically connected to the first complementary data line and the second complementary data line in response to the write control signal, a gate of the fourth NMOS transistor is electrically connected to the second complementary data line, a drain of the fourth NMOS transistor is electrically connected to the first data line, a source of the fourth NMOS transistor is electrically connected to a drain of the fifth NMOS transistor, and a source of the fifth NMOS transistor is grounded. Furthermore, the read unit includes: a tenth NMOS transistor and a twelfth NMOS transistor; a gate of the twelfth NMOS transistor receives the read control signal; and a drain of the twelfth NMOS transistor is electrically connected to the second data line, a source of the twelfth NMOS transistor is electrically connected to a drain of the tenth NMOS transistor, a gate of the tenth NMOS transistor is electrically connected to the first complementary data line, and a source of the tenth NMOS transistor is grounded.

Furthermore, the read unit further includes: a ninth NMOS transistor and an eleventh NMOS transistor; the ninth NMOS transistor has a gate electrically connected to the first data line, a source grounded and a drain electrically connected to a source of the eleventh NMOS transistor; and a gate of the eleventh NMOS transistor receives the read control signal, and a drain of the eleventh NMOS transistor is electrically connected to the second complementary data line.

Furthermore, the read/write switching circuit further includes: a pre-charging module, the pre-charging module being connected between the first data line and the first complementary data line and configured to pre-charge the first data line and the first complementary data line in response to a pre-charging control signal.

Furthermore, the pre-charging module includes: a third PMOS transistor, a fourth PMOS transistor and a fifth PMOS transistor, a gate of the third PMOS transistor, a gate of the fourth PMOS transistor and a gate of the fifth PMOS transistor receiving the pre-charging control signal; and a source of the third PMOS transistor and a source of the fourth PMOS transistor being connected to the operating power supply, and a drain of the third PMOS transistor being electrically connected to the first data line; a drain of the fourth PMOS transistor being electrically connected to the first complementary data line; and the fifth PMOS transistor being electrically connected to the first data line and the first complementary data line in response to the pre-charging control signal.

Correspondingly, the embodiments of the present application further provide a memory including the read/write switching circuit described above.

Furthermore, the memory further includes: a plurality of storage modules, each storage module including a memory array and a sensitive amplifier array; and the read/write switching circuit being connected to the sensitive amplifier array.

Furthermore, the memory includes a DRAM, a static random-access memory (SRAM), a magnetoresistive random access memory (MRAM), a ferroelectric RAM (Fe-RAM), a phase change RAM (PCRAM), an NAND flash memory or a NOR flash memory.

Compared with the prior art, the technical solutions according to the embodiments of the present application have the following advantages:

The embodiments of the present application provide a read/write switching circuit, including: a first data line connected to a BL through a column select module and a first complementary data line connected to a complementary BL through the column select module; and a read/write switching module configured to transmit data between the first data line and a second data line and transmit data between the first complementary data line and a second complementary data line in response to a read control signal or a write control signal; and further including an amplification module connected between the first data line and the first complementary data line and configured to amplify the data of the first data line and the data of the first complementary data line. The amplification module is provided, which is conducive to accelerating distinction between data signals of the first data line and the first complementary data line and plays a role of amplifying the data signals, so that a data transmission speed in the read/write switching circuit is increased.

The memory according to the present application includes the read/write switching circuit with excellent structural performance, and the memory correspondingly has an advantage of fast transmission. In addition, due to the arrangement of the amplification module, the read/write switching circuit in the memory has low requirements on driving capability of the memory. Specifically, the first data line and the first complementary data line have low requirement on driving capability of a first sense amplifier (FSA) in the memory. Therefore, the FSA, even if having a reduced area, can still have enough driving capability to meet a development trend of device miniaturization.

BRIEF DESCRIPTION OF DRAWINGS

In the accompanying drawings, reference numerals that are identical throughout the plurality of accompanying drawings represent identical or similar components or elements, unless otherwise specified. These accompanying drawings are not necessarily drawn in scale. It should be understood that the accompanying drawings describe only some embodiments of the present invention, and should not be considered as limiting the scope of the present invention.

DESCRIPTION OF EMBODIMENTS

Figure 1:
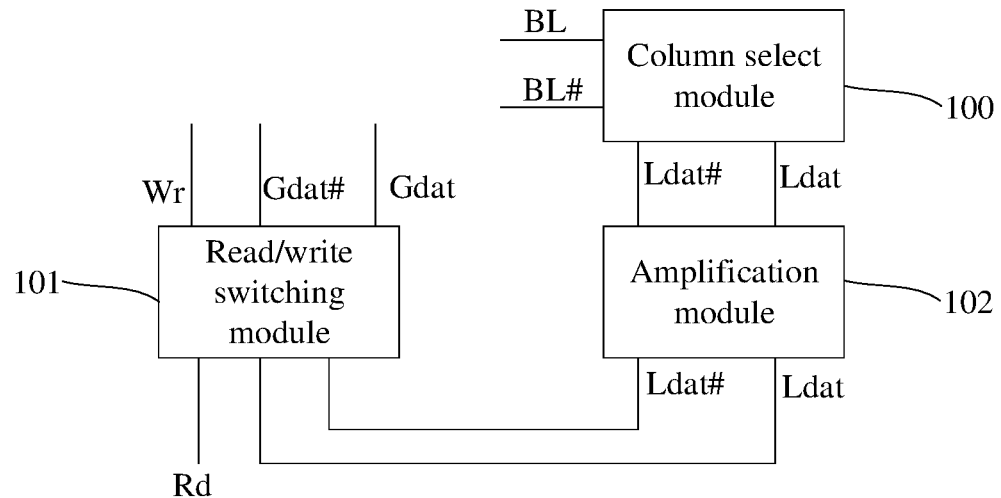
FIG. 1 is a schematic diagram of functional modules of a read/write switching circuit according to an embodiment of the present application.

In a DRAM read operation, after a selected WL is activated, data in a corresponding storage unit may be transmitted to a BL, resulting in a slight increase or decrease in a voltage on the BL. A sense amplifier connected to the BL, generally referred to as an FSA, may pull a BL signal to 0 or 1 based on the weak signal. A column select module may transmit the signal 0 or 1 on the selected BL to a local data line based on a column select signal, and then transmit a signal in the local data line to a global data line through a read/write switching circuit. It should be noted that 0 represents that the signal is at a low level, and 1 represents that the signal is at a high level.

However, in order to ensure a high data transmission speed, driving performance of an FSA of a memory is required to be high. For example, in the case of data read, after a level of a column select line (CSL) is pulled up, the FSA may directly drive the local data line. If the FSA has insufficient driving capability, a speed at which a level of the local data line is pulled up or down may be greatly affected. However, with the process update and the requirements on area reduction, the FSA is becoming smaller and smaller, but it is difficult to improve the driving capability of the corresponding FSA. Therefore, in order to ensure high data transmission capability, how to lower the requirements of the local data line on the driving capability of the FSA is required to be taken into account.

In order to solve the above problems, an embodiment of the present application provides a read/write switching circuit, a first data line is connected to a BL through a column select module, a first complementary data line is connected to a complementary BL through the column select module, and an amplification module is arranged between the first data line and the first complementary data line and configured to amplify data signals of the first data line and the first complementary data line, so as to accelerate distinction between the first data line and the first complementary data line. For example, the first data line or the first complementary data line with a lower voltage becomes 0 more quickly, and the first data line or the first complementary data line with a higher voltage becomes 1 more quickly, so as to accelerate data transmission of a read or write operation, which lowers the requirements of the first data line or the first complementary data line on the driving capability of the FSA.

In order to make the objectives, technical solutions and advantages of the present application clearer, embodiments of the present application are elaborated in detail below with reference to the accompanying drawings. However, those of ordinary skill in the art may understand that, lots of technical details are provided in the embodiments of the present application in order to make a reader better understand the present application. However, the technical solutions claimed in the present application can also be implemented even without such technical details and based on various changes and modifications to the following embodiments.

Figure 2:
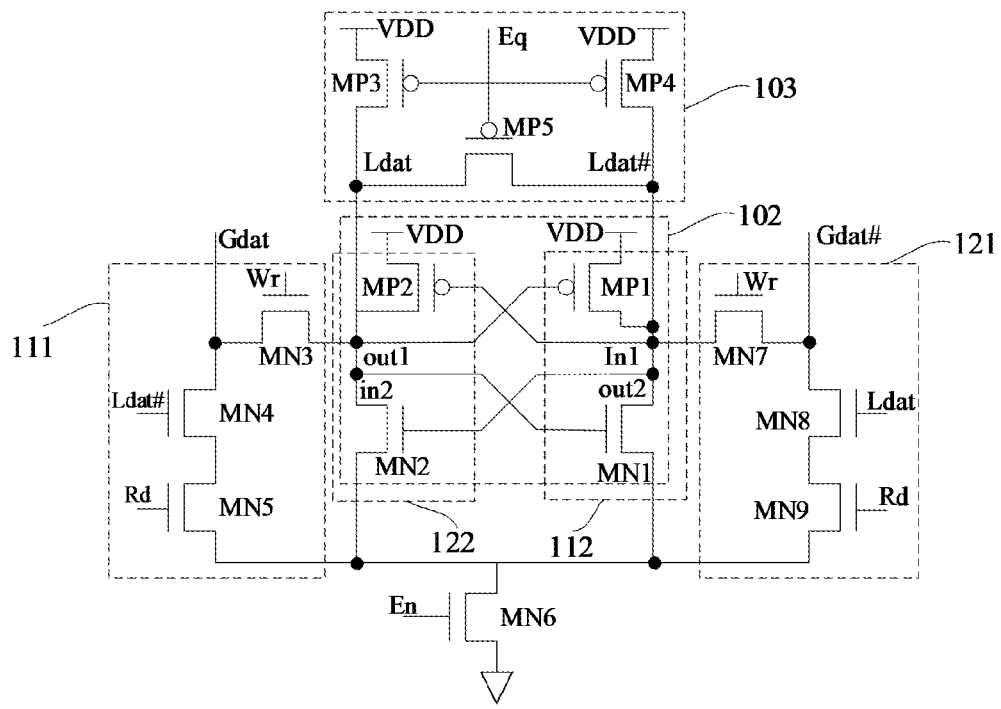
FIG. 2 is a schematic diagram of a circuit structure of the read/write switching circuit according to an embodiment of the present application.

FIG. 1 is a schematic diagram of functional modules of a read/write switching circuit according to an embodiment of the present application, and FIG. 2 is a schematic diagram of a circuit structure according to an embodiment of the present application.

Referring to FIG. 1 and FIG. 2 together, in this embodiment, the read/write switching circuit includes: a first data line Ldat and a first complementary data line Ldat #, the first data line Ldat being connected to a BL through a column select module 100, and the first complementary data line Ldat #being electrically connected to a complementary bit line BL #through the column select module 100; a second data line Gdat and a second complementary data line Gdat #; a read/write switching module 101 configured to transmit data between the first data line Ldat and the second data line Gdat and transmit data between the first complementary data line Ldat #and the second complementary data line Gdat #during read and write operations in response to read and write control signals; and an amplification module 102 connected between the first data line Ldat and the first complementary data line Ldat #and configured to amplify data of the first data line Ldat and data of the first complementary data line Ldat #.

The amplification module 102 constitutes a circuit to amplify a signal of the first data line Ldat and a signal of the first complementary data line Ldat #, which helps to accelerate distinction between a level of the first data line Ldat and a level of the first complementary data line Ldat #, thereby increasing a data signal transmission speed and a data read/write speed. Furthermore, since data signals of the first data line Ldat and the first complementary data line Ldat #are amplified, the first data line Ldat and the first complementary data line Ldat #lower the requirements on driving capability of an FSA in a memory. Therefore, even if an area of the FSA is gradually reduced, the FSA still has sufficient driving capability for the first data line Ldat and the first complementary data line Ldat #, so as to ensure that the read/write switching circuit has good electrical performance and then improve the storage performance of the memory including the read/write switching circuit while meeting the development trend of device miniaturization.

The read/write switching circuit according to this embodiment is described in detail below with reference to the accompanying drawings.

In this embodiment, data is read or data signals are written in pairs. Each pair of data signals includes two pieces of data. During read and write operations, one of the two pieces of data is a high-level signal and the other is a low-level signal. Therefore, the read/write switching circuit includes at least one pair of the first data line Ldat and the first complementary data line Ldat #, and at least one pair of the second data line Gdat and the second complementary data line Gdat #. Specifically, the read/write switching circuit transmits data to the second data line Gdat and the second complementary data line Gdat #through the first data line Ldat and the first complementary data line Ldat #during the read operation; and the read/write switching circuit transmits the data to the first data line Ldat and the first complementary data line Ldat #through the second data line Gdat and the second complementary data line Gdat #during the write operation.

The first data line Ldat is a local data line, and the first complementary data line Ldat #is a complementary local data line. The second data line Gdat is a global data line, and the second complementary data line Gdat #is a complementary global data line.

In one specific embodiment, the read/write switching circuit is applied to a memory. The memory includes the column select module 100. The first data line Ldat is connected to the BL through the column select module 100, and the first complementary data line Ldat #is connected to the complementary bit line BL #through the column select module 100. A storage unit to perform a read operation or a write operation is selected through the column select module 100. Correspondingly, a signal is transmitted between the BL and the first data line Ldat that are connected to the selected storage unit, and a signal is transmitted between the complementary bit line BL #and the first complementary data line Ldat #that are connected to the selected storage unit.

The read and write control signals include a read control signal Rd and a write control signal Wr. During the read and write operations, the read/write switching module 101 transmits data of the first data line Ldat and the first complementary data line Ldat #to the second data line Gdat and the second complementary data line Gdat #in response to the read control signal Rd, or the read/write switching module 101 transmits data of the second data line Gdat and the second complementary data line Gdat #to the first data line Ldat and the first complementary data line Ldat #in response to the write control signal Wr.

In this embodiment, the read/write switching module 101 includes: a first read/write unit 111 configured to transmit data of the first data line Ldat to the second data line Gdat in response to the read control signal Rd, or transmit data of the second data line Gdat to the first data line Ldat in response to the write control signal Wr; and a second read/write unit 121 configured to transmit data of the first complementary data line Ldat #to the second complementary data line Gdat #in response to the read control signal Rd, or transmit data of the second complementary data line Gdat #to the first complementary data line Ldat #in response to the write control signal Wr.

In one specific embodiment, the first read/write unit 111 may include: a third NMOS transistor MN3, a fourth NMOS transistor MN4 and a fifth NMOS transistor MN5. A gate of the third NMOS transistor MN3 receives the write control signal Wr, and the third NMOS transistor MN3 is electrically connected to the first data line Ldat and the second data line Gdat in response to the write control signal Wr. A gate of the fourth NMOS transistor MN4 is electrically connected to the first complementary data line Ldat #, a drain of the fourth NMOS transistor MN4 is electrically connected to the second data line Gdat, a source of the fourth NMOS transistor MN4 is electrically connected to a drain of the fifth NMOS transistor MN5, and a gate of the fifth NMOS transistor MN5 receives the read control signal Rd.

The second read/write unit 121 may include: a seventh NMOS transistor MN7, an eighth NMOS transistor MN8 and a ninth NMOS transistor MN9. A gate of the seventh NMOS transistor MN7 receives the write control signal Wr, and the seventh NMOS transistor MN7 is electrically connected to the first complementary data line Ldat #and the second complementary data line Gdat #in response to the write control signal Wr. The eighth NMOS transistor MN8 has a gate electrically connected to the first data line Ldat, a drain electrically connected to the second complementary data line Gdat #, and a source electrically connected to a drain of the ninth NMOS transistor MN9, and a gate of the ninth NMOS transistor MN9 receives the read control signal Rd.

In this embodiment, the first read/write unit 111 has the same circuit structure as the second read/write unit 121; that is, connection relationships among the transistors included in the first read/write unit 111 are the same as those among the transistors included in the second read/write unit 121. In other embodiments, the first read/write unit and the second read/write unit may have different circuit structures, provided that data transmission can be realized during the read and write operations.

In this embodiment, the read/write switching circuit may further include: a sixth NMOS transistor MN6. A gate of the sixth NMOS transistor MN6 receives an enable signal En, a drain of the sixth NMOS transistor MN6 is electrically connected to the source of the fifth NMOS transistor MN5 and the source of the ninth NMOS transistor MN9, and a source of the sixth NMOS transistor MN6 is grounded.

During the read operation, the data is first transmitted from the selected BL and the complementary bit line BL #to the first data line Ldat and the first complementary data line Ldat #through the column select module 100. After being amplified by the amplification module 102, the first data line Ldat and the first complementary data line Ldat #may quickly reach a low or high level. Then, the data is transmitted from the first data line Ldat and the first complementary data line Ldat #to the second data line Gdat and the second complementary data line Gdat #. When the read control signal Rd is at a high level and the write control signal Wr is at a low level, the first NMOS transistor MN3 and the seventh NMOS transistor MN7 are turned off, and the fifth NMOS transistor MN5 and the ninth NMOS transistor MN9 are turned on. When the first data line Ldat is at a high level, the first complementary data line Ldat #is at a low level and the enable signal EN is at a high level, the eighth NMOS transistor MN8 and the sixth NMOS transistor MN6 are turned on, the data is transmitted from the first complementary data line Ldat #to the second complementary data line Gdat #, the second complementary data line Gdat #becomes 0, and the second data line Gdat is 1. When the first data line Ldat is at a low level and the first complementary data line Ldat #is at a high level, the fourth NMOS transistor MN4 and the sixth NMOS transistor MN6 are turned on, the data is transmitted from the first data line Ldat to the second data line Gdat, the second data line Gdat becomes 0, and the second complementary data line Gdat #is 1. The second data line Gdat becoming 0 means that the second data line Gdat changes from a high level to a low level. The second complementary data line Gdat #being 1 means that the second complementary data line Gdat #is at a high level.

In the embodiment of the present application, "being 1" means that the level is a high level, "being 0" means that the level is a low level, "becoming 1" means that the level changes to a high level, and "becoming 0" means that the level changes to a low level.

A data transmission direction during the write operation is opposite to that during the read operation; that is, the data is transmitted from the second data line Gdat and the second complementary data line Gdat #to the first data line Ldat and the first complementary data line Ldat #.

Referring to FIG. 2, in this embodiment, the amplification module 102 includes: a first inverter 112, a first input terminal in1 of the first inverter 112 being electrically connected to the first data line Ldat; and a second inverter 122, a second input terminal in2 of the second inverter 122 being electrically connected to a first output terminal out1 of the first inverter 112 and the first complementary data line Ldat #, and a second output terminal out2 of the second inverter 122 being electrically connected to the first input terminal in1 of the first inverter 112 and the first data line Ldat.

During the read, due to the arrangement of the amplification module 102, the data is transmitted faster from the BL to the first data line Ldat, the data is transmitted faster from the complementary bit line BL #to the first complementary data line Ldat #, and the memory has low requirements on the driving of the FSA. Specifically, in an example where the data of the BL is at a high level and the data of the complementary bit line BL #is at a low level, since the first input terminal in1 of the first inverter 112 is connected to the second output terminal out2 of the second inverter 122 and the first output terminal out1 of the first inverter 112 is connected to the second input terminal in2 of the second inverter 122, during the transmission from the BL and the complementary bit line BL #to the first data line Ldat and the first complementary data line Ldat #, the arrangement of the amplification module 102 may make the first complementary data line Ldat #with a lower level pulled down to "0" more quickly, or make the first data line Ldat with a higher level pulled up to "1" more quickly. Therefore, the level of the first data line Ldat is pulled up faster, and the level of the first complementary data line Ldat #is pulled down faster. So, the first data line Ldat and the first complementary data line Ldat #have lower requirements on the driving of the FSA.

At the same time, since the first data line Ldat and the first complementary data line Ldat #can reach a high or low level more quickly, data can be transmitted from the first data line Ldat and the first complementary data line Ldat #to the second data line Gdat and the second complementary data line Gdat #earlier. In this way, the data is transmitted, in the case of data read, faster from the first data line Ldat and the first complementary data line Ldat #to the second data line Gdat and the second complementary data line Gdat #.

Correspondingly, during the write, the amplification module 102 can also amplify the first data line Ldat and the first complementary data line Ldat #, and speed up the data transmission from the second data line Gdat and the second complementary data line Gdat #to the first data line Ldat and the first complementary data line Ldat #.

Specifically, the first inverter 112 includes: a first PMOS transistor MP1 and a first NMOS transistor MN1. A gate of the first PMOS transistor MP1 is electrically connected to a gate of the first NMOS transistor MN1 and serves as the first input terminal in1 of the first inverter. A source of the first PMOS transistor MP1 is connected to an operating power supply VDD. A drain of the first PMOS transistor MP1 is connected to a drain of the first NMOS transistor MN1 and serves as the first output terminal out1 of the first inverter 112.

The second inverter 122 includes: a second PMOS transistor MP2 and a second NMOS transistor MN2. A gate of the second PMOS transistor MP2 is connected to a gate of the second NMOS transistor MN2 and serves as the second input terminal in2 of the second inverter 122. A source of the second PMOS transistor MP2 is connected to the operating power supply VDD. A drain of the second PMOS transistor MP2 is connected to a drain of the second NMOS transistor MN2 and serves as the second output terminal out2 of the second inverter 122.

The first PMOS transistor MP1, the first NMOS transistor MN1, the second PMOS transistor MP2 and the second NMOS transistor MN2 constitute the amplification module 102.

In addition, the first inverter 112 and the second inverter 122 are further connected to the drain of the sixth NMOS transistor. Specifically, a source of the first NMOS transistor MN1 and a source of the second NMOS transistor MN2 are connected to the drain of the sixth NMOS transistor MN6. In some other embodiments, the source of the first NMOS transistor MN1 is grounded, and the source of the second NMOS transistor MN2 is grounded.

In this embodiment, referring to FIG. 2, the read/write switching circuit may further include: a pre-charging module 103. The pre-charging module 103 is connected between the first data line Ldat and the first complementary data line Ldat #and configured to pre-charge the first data line Ldat and the first complementary data line Ldat #in response to a pre-charging control signal Eq.

Specifically, the pre-charging module 103 includes: a third PMOS transistor MP3, a fourth PMOS transistor MP4 and a fifth PMOS transistor MP5. A gate of the third PMOS transistor MP3, a gate of the fourth PMOS transistor MP4 and a gate of the fifth PMOS transistor MP5 receive the pre-charging control signal Eq. A source of the third PMOS transistor MP3 and a source of the fourth PMOS transistor MP4 are connected to the operating power supply VDD, and a drain of the third PMOS transistor MP3 is electrically connected to the first data line Ldat. A drain of the fourth PMOS transistor MP4 is electrically connected to the first complementary data line Ldat #. The fifth PMOS transistor MP5 is electrically connected to the first data line Ldat and the first complementary data line Ldat #in response to the pre-charging control signal Eq.

Figure 3:
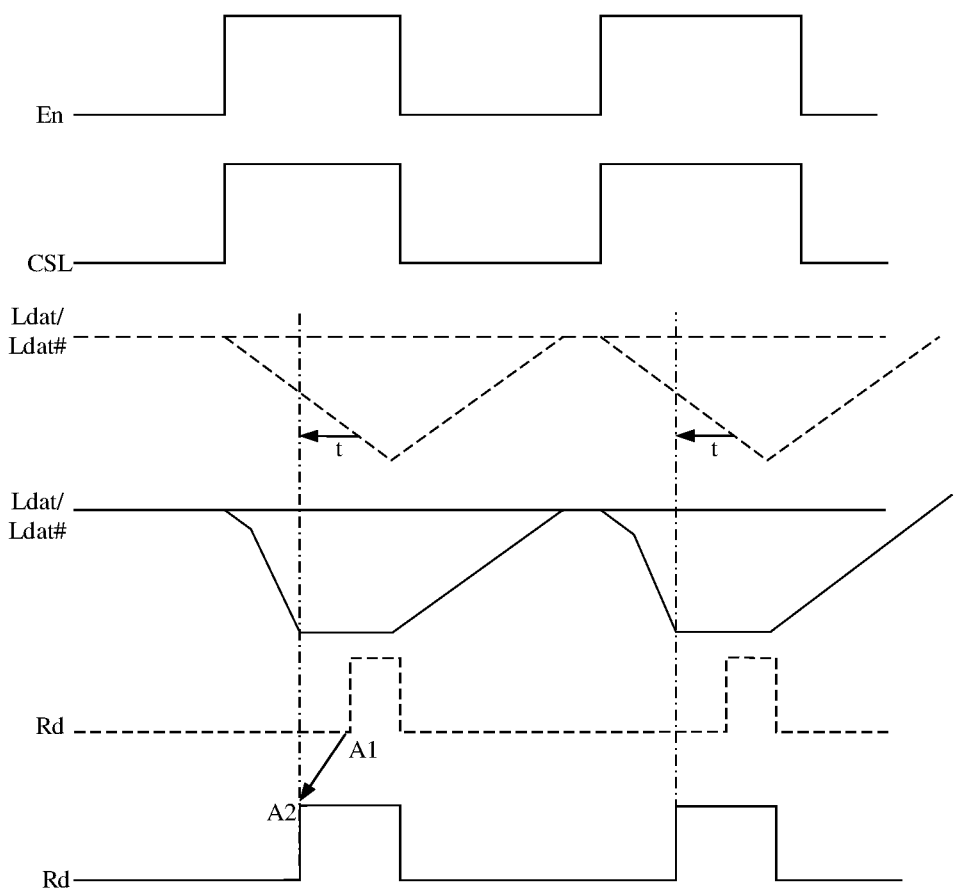
FIG. 3 is a circuit timing sequence diagram of the read/write switching circuit during a read operation according to an embodiment of the present application.

FIG. 3 is a circuit timing sequence diagram of a read/write switching circuit without any amplification module and of the read/write switching circuit according to this embodiment during a read operation. For the convenience of distinction, in the circuit timing sequence diagram, for the same signal with a change in timing sequence, the dotted line represents a timing sequence corresponding to a situation where no amplification module is added, the solid line represents a timing sequence corresponding to this embodiment, and CSL represents a column select signal.

As shown in FIG. 3, compared with the read/write switching circuit without any amplification module, in this embodiment, data of the first data line Ldat and the first complementary data line Ldat #reaches a high level and a low level respectively time t in advance. That is, in this embodiment, the data may be transmitted time tin advance, a rising edge time of the read control signal Rd may be advanced from time A1 to time A2, and a difference between the time A2 and the time A1 is t.

Another embodiment of the present application further provides a read/write switching circuit. A specific circuit structure of the read/write switching module in this embodiment is different from that in the previous embodiment. The read/write switching circuit according to this embodiment is described below with reference to the accompanying drawings. It should be noted that parts the same as or corresponding to those in the previous embodiment can be obtained with reference to the detailed descriptions of the previous embodiment and are not described in detail below.

Figure 4:
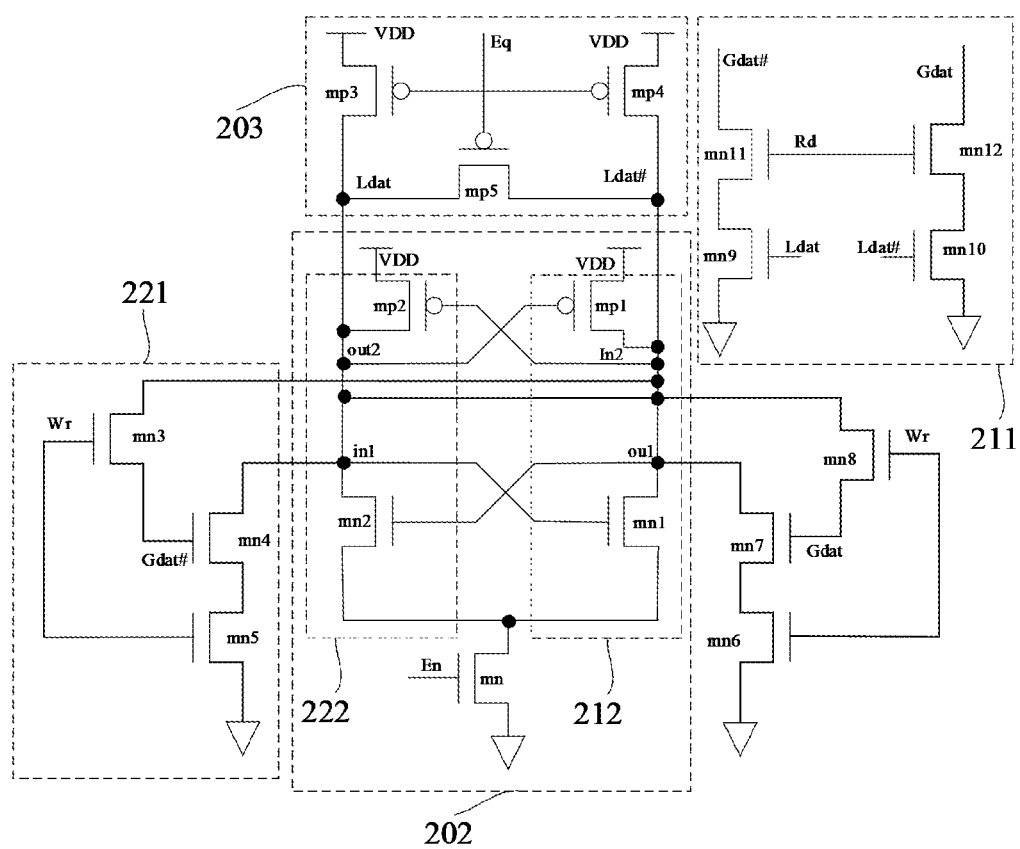
FIG. 4 is a schematic diagram of a circuit structure of a read/write switching circuit according to another embodiment of the present application.

FIG. 4 is a schematic diagram of a circuit structure of a read/write switching circuit according to another embodiment of the present application.

Referring to FIG. 4, in this embodiment, the read/write switching circuit includes: a first data line Ldat, a first complementary data line Ldat #, a second data line Gdat, a second complementary data line Gdat #, a read/write switching module and an amplification module 202.

The read/write switching circuit according to this embodiment is described in detail below with reference to the accompanying drawings.

The amplification module 202 includes a first inverter 212 and a second inverter 222. The first inverter 212 includes a first PMOS transistor mp1 and a first NMOS transistor mn1. The second inverter 222 includes a second PMOS transistor mp2 and a second NMOS transistor mn2 Detailed descriptions of the first inverter and the second inverter can be obtained with reference to the detailed descriptions of the previous embodiment.

Different from the previous embodiment, in this embodiment, the amplification module 202 further includes: an enable NMOS transistor mn. A drain of the enable NMOS transistor mn is electrically connected to the first inverter 212 and the second inverter 222, a gate of the enable NMOS transistor receives an enable signal En, and a source of the enable NMOS transistor mn is grounded.

Specifically, the drain of the enable NMOS transistor mn is electrically connected to the source of the first NMOS transistor mn1 and the source of the second NMOS transistor mn2.

The first PMOS transistor mp1, the first NMOS transistor mn1, the second PMOS transistor mp2, the second NMOS transistor mn2 and the enable NMOS transistor mn constitute the amplification module 202, which is configured to amplify data of the first data line Ldat and the first complementary data line Ldat #.

In this embodiment, the read/write switching module includes: a read unit 211 configured to transmit data of the first data line Ldat and the first complementary data line Ldat #to the second data line Gdat and the second complementary data line Gdat #respectively in response to the read control signal Rd; and a write unit 221 configured to transmit data of the second data line Gdat and the second complementary data line Gdat #to the first data line Ldat and the first complementary data line Ldat #respectively in response to the write control signal Wr.

Specifically, the write unit 221 includes: a third NMOS transistor mn3, a fourth NMOS transistor mn4, a fifth NMOS transistor mn5, a sixth NMOS transistor mn6, a seventh NMOS transistor mn7 and an eighth NMOS transistor mn8.

A drain of the third NMOS transistor mn3 is electrically connected to a first output terminal out1 of the first inverter 212, a gate of the third NMOS transistor mn3 and a gate of the fifth NMOS transistor mn5 receive the write control signal Wr, the third NMOS transistor mn3 is electrically connected to the first complementary data line Ldat #and the second complementary data line Gdat #in response to the write control signal Wr, a gate of the fourth NMOS transistor mn4 is electrically connected to the second complementary data line Gdat #, and a drain of the fourth NMOS transistor mn4 is electrically connected to the first data line Ldat. A source of the fourth NMOS transistor mn4 is electrically connected to a drain of the fifth NMOS transistor mn5, and a source of the fifth NMOS transistor mn5 is grounded. A drain of the eighth NMOS transistor mn8 is electrically connected to a second output terminal out2 of the second inverter 222, a gate of the eighth NMOS transistor mn8 and a gate of the sixth NMOS transistor mn6 receive the write control signal Wr, and the eighth NMOS transistor mn8 is electrically connected to the first data line Ldat and the second data line Gdat in response to the write control signal Wr. A gate of the seventh NMOS transistor mn7 is electrically connected to the second data line Gdat, a drain of the seventh NMOS transistor mn7 is electrically connected to the first complementary data line Ldat #, a source of the seventh NMOS transistor mn7 is electrically connected to a drain of the sixth NMOS transistor mn6, and a source of the sixth NMOS transistor mn6 is grounded.

During the write operation, the write unit 221 is configured to transmit data of the second data line Gdat to the first data line Ldat and transmit data of the second complementary data line Gdat #to the first complementary data line Ldat #.

Specifically, during the write operation, when the write control signal Wr is at a high level, the third NMOS transistor mn3, the fifth NMOS transistor mn5, the sixth NMOS transistor mn6 and the eighth NMOS transistor mn8 are turned on; when the second complementary data line Gdat #is at a high level, the fourth NMOS transistor mn4 is turned on and the seventh NMOS transistor mn7 is turned off, the data of the second complementary data line Gdat #is transmitted to the first complementary data line Ldat #, the first data line Ldat becomes 0, and the first complementary data line Ldat #becomes 1. The arrangement of the amplification module 202 reduces the time required for the first data line Ldat becoming 0, thereby speeding up the distinction between the first data line Ldat and the first complementary data line Ldat #, so as to faster write the data of the first data line Ldat and the first complementary data line Ldat #to the corresponding storage unit.

When the second complementary data line Gdat #is at a low level, the second data line Gdat is at a high level, the fourth NMOS transistor mn4 is turned off and the seventh NMOS transistor mn7 is turned on, data of the second data line Gdat is transmitted to the first data line Ldat, the first complementary data line Ldat #becomes 0, and the first data line Ldat becomes 1. The arrangement of the amplification module 202 reduces the time required for the first complementary data line Ldat #becoming 0, thereby speeding up the distinction between the first data line Ldat and the first complementary data line Ldat #, so as to faster write the data of the first data line Ldat and the first complementary data line Ldat #to the corresponding storage unit.

Specifically, the read unit 211 includes: a ninth NMOS transistor mn9, a tenth NMOS transistor mn10, an eleventh NMOS transistor mn11 and a twelfth NMOS transistor mn12.

The ninth NMOS transistor mn9 has a gate electrically connected to the first data line Ldat, a source grounded and a drain electrically connected to a source of the eleventh NMOS transistor mn11. Gates of the eleventh NMOS transistor mn11 and the twelfth NMOS transistor mn12 receive the read control signal Rd, and a drain of the eleventh NMOS transistor mn11 is electrically connected to the second complementary data line Gdat #.

The gate of the twelfth NMOS transistor mn12 receives the read control signal Rd, a drain of the twelfth NMOS transistor mn12 is electrically connected to the second data line Gdat, a source of the twelfth NMOS transistor mn12 is electrically connected to a drain of the tenth NMOS transistor mn10, a gate of the tenth NMOS transistor mn10 is electrically connected to the first complementary data line Ldat #, and a source of the tenth NMOS transistor mn10 is grounded.

During the read operation, the read unit 211 is configured to transmit data of the first data line Ldat to the second data line Gdat and transmit data of the first complementary data line Ldat #to the second complementary data line Gdat #.

Specifically, during the read operation, when the read control signal Rd is at a high level, the eleventh NMOS transistor mn11 and the twelfth NMOS transistor mn12 are turned on. When the first data line Ldat is at a high level, the ninth NMOS transistor mn9 is turned on and the tenth NMOS transistor mn10 is turned off, data of the first data line Ldat is transmitted to the second data line Gdat, the second complementary data line Gdat #becomes 0, and the second data line Gdat becomes 1. When the first data line Ldat is at a low level, the ninth NMOS transistor mn9 is turned off and the tenth NMOS transistor mn10 is turned on, data of the first complementary data line Ldat #is transmitted to the second complementary data line Gdat #, the second complementary data line Gdat #becomes 1, and the second data line Gdat becomes 0. Due to the arrangement of the amplification module 202, the reaction time during which the first data line Ldat or the first complementary data line Ldat #changes from a high level to a low level is reduced. Therefore, the second data line GDAT and the second complementary data line GDAT #follow the change faster, so as to increase the data transmission speed.

It should be noted that the circuit diagram involved in FIG. 4 may also have other suitable variations. For example, the gates of the ninth NMOS transistor mn9 and the tenth NMOS transistor mn10 receive the read control signal Rd, the gate of the eleventh NMOS transistor mn11 is connected to the first data line Ldat, and the gate of the twelfth NMOS transistor mn12 is connected to the first complementary data line Ldat #; or the source of the fifth NMOS transistor mn5 and the source of the sixth NMOS transistor mn6 are electrically connected to the drain of the enable NMOS transistor mn.

It may be understood that in the example of FIG. 4, both the write unit 221 and the read unit 211 are in a two-terminal transmission mode. That is, both the first data line Ldat and the first complementary data line Ldat #are connected to the write unit 221, and both the second data line Gdat and the second complementary data line Gdat #are connected to the read unit 211. In other embodiments, at least one of the write unit and the read unit may also be in a single-terminal transmission mode. That is, one of the first data line and the first complementary data line is connected to the write unit, and one of the second data line and the second complementary data line is connected to the read unit. In an example where the write unit and the read unit are both in the single-terminal transmission mode, FIG. 5 is a schematic diagram of another circuit structure of the read/write switching circuit according to this embodiment.

Figure 5:
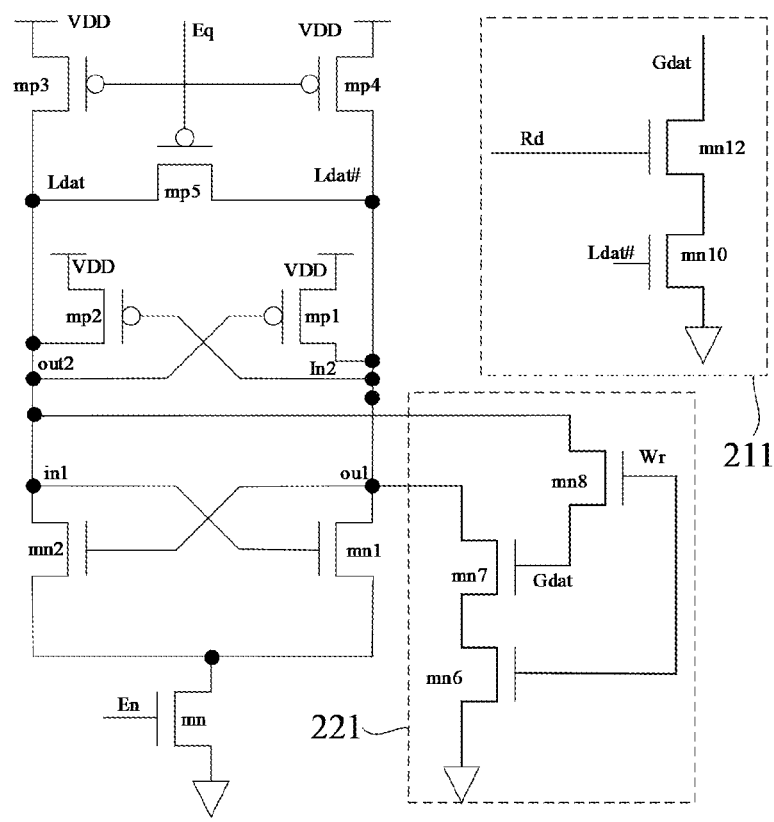
FIG. 5 is a schematic diagram of another circuit structure of the read/write switching circuit according to another embodiment of the present application.

Referring to FIG. 5, the write unit 221 includes: a sixth NMOS transistor mn6, a seventh NMOS transistor mn7 and an eighth NMOS transistor mn8. A gate of the eighth NMOS transistor mn8 and a gate of the sixth NMOS transistor mn6 receive the write control signal Wr, the eighth NMOS transistor mn8 is electrically connected to the first data line Ldat and the second data line Gdat in response to the write control signal Wr, a gate of the seventh NMOS transistor mn7 is electrically connected to the second data line Gdat, a drain of the seventh NMOS transistor mn7 is electrically connected to the first complementary data line Ldat #, a source of the seventh NMOS transistor mn7 is electrically connected to a drain of the sixth NMOS transistor mn6, and a source of the sixth NMOS transistor mn6 is grounded.

Still referring to FIG. 5, the read unit 211 includes: a tenth NMOS transistor mn10 and a twelfth NMOS transistor mn12; a gate of the twelfth NMOS transistor mn12 receives the read control signal R6; and a drain of the twelfth NMOS transistor mn12 is electrically connected to the second data line Gdat, a source of the twelfth NMOS transistor mn12 is electrically connected to a drain of the tenth NMOS transistor mn10, a gate of the tenth NMOS transistor mn10 is electrically connected to the first complementary data line Ldat #, and a source of the tenth NMOS transistor mn10 is grounded.

In this embodiment, referring to FIG. 4, the read/write switching circuit may further include: a pre-charging module 203.

Specifically, the pre-charging module 203 includes: a third PMOS transistor mp3, a fourth PMOS transistor mp4 and a fifth PMOS transistor mp5. A gate of the third PMOS transistor mp3, a gate of the fourth PMOS transistor mp4 and a gate of the fifth PMOS transistor mp5 receive the pre-charging control signal Eq. A source of the third PMOS transistor mp3 and a source of the fourth PMOS transistor mp4 are connected to the operating power supply VDD, and a drain of the third PMOS transistor mp3 is electrically connected to the first data line Ldat. A drain of the fourth PMOS transistor mp4 is electrically connected to the first complementary data line Ldat #. The fifth PMOS transistor mp5 is electrically connected to the first data line Ldat and the first complementary data line Ldat #in response to the pre-charging control signal Eq.

It may be understood that the read/write switching circuit according to this embodiment may be configured only for signal amplification during one of the read operation and the write operation, or configured for signal amplification during the read operation and the write operation.

In addition, it should be noted that "becoming 0" or "becoming 1" mentioned above may include the following situations: for a data line (e.g., the first data line Ldat, the first complementary data line Ldat #, the second data line Gdat or the second complementary data line Gdat #), if a state after pre-charging is "pre-charged to 0", "becoming 0" described for next state of the data line should be interpreted as "staying at 0"; and if the state after pre-charging is "pre-charged to 1", "becoming 1" described for the next state of the data line should be interpreted as "staying at 1". Compared with the previous embodiment, in the read/write switching circuit according to this embodiment, since the second complementary data line Gdat #in the write unit simultaneously affects the first data line Ldat and the first complementary data line Ldat or the second data line Gdat simultaneously affects the first data line Ldat and the first complementary data line Ldat, a memory using the read/write switching circuit has a faster write operation.

Figure 6:
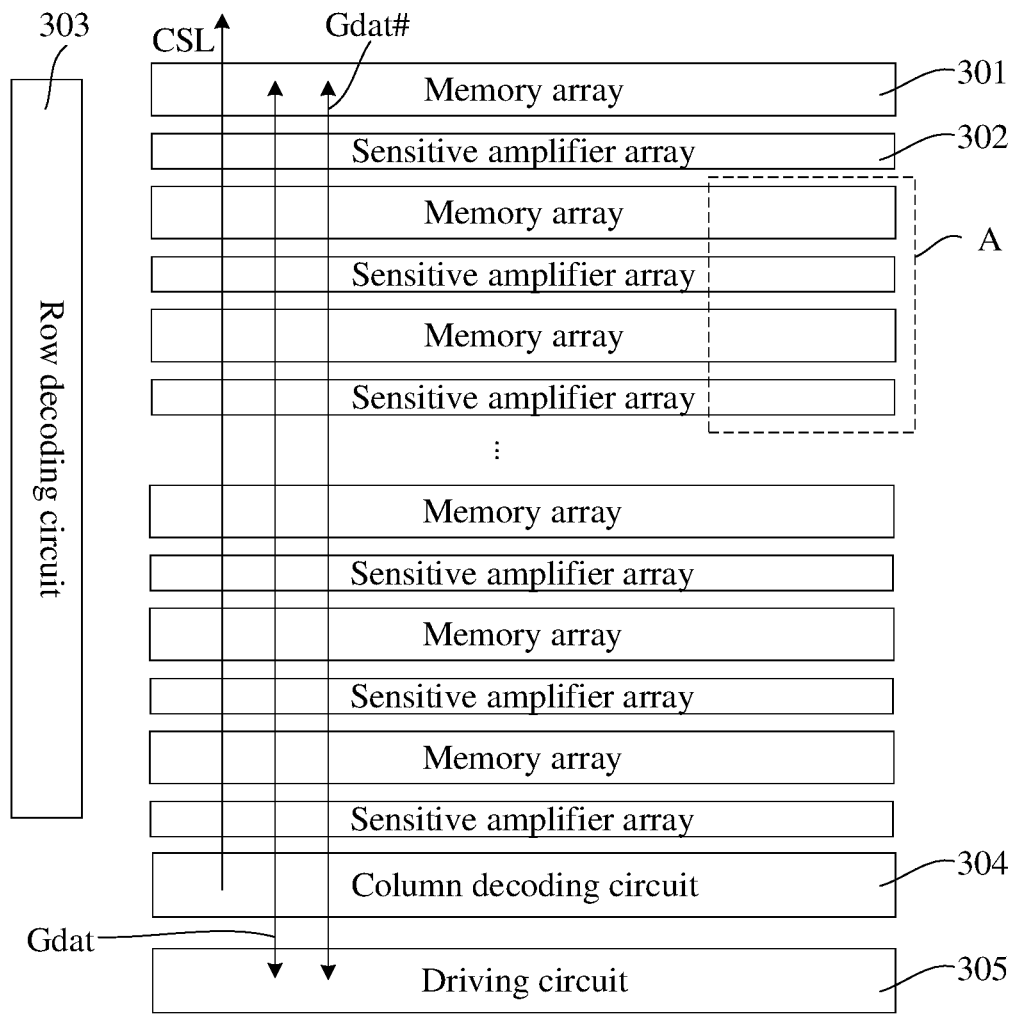
FIG. 6 is a schematic diagram of a memory according to an embodiment of the present application.

Correspondingly, an embodiment of the present application further provides a memory including the read/write switching circuit according to any one of the embodiments. FIG. 6 is a schematic structural diagram of a memory according to an embodiment of the present application, and FIG. 7 is a schematic partially enlarged structural diagram of region A in FIG. 6.

Figure 7:
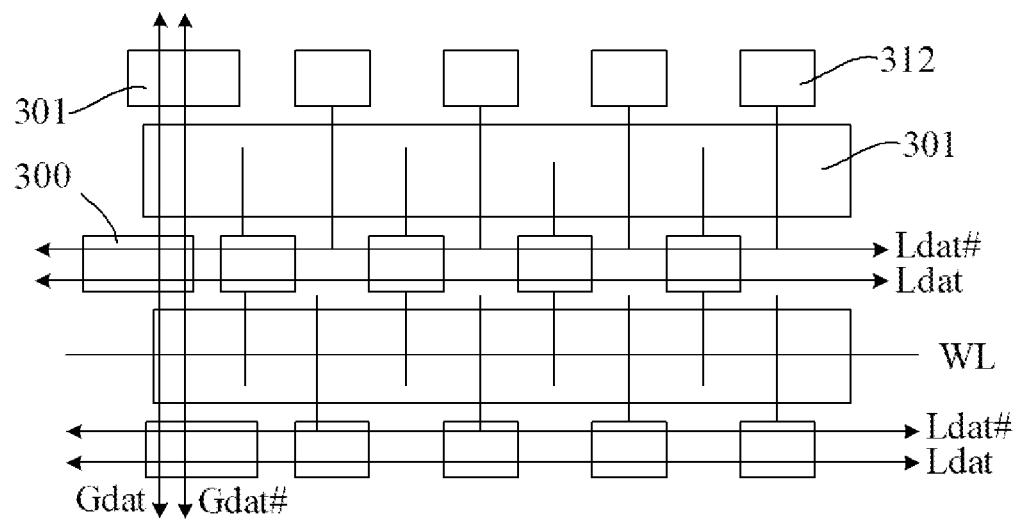
FIG. 7 is a schematic partially enlarged structural diagram of region A in FIG. 6.

Referring to FIG. 6 and FIG. 7, the memory includes: a plurality of storage modules, each storage module including a memory array 301 and a sensitive amplifier array 302, the sensitive amplifier array 302 including a plurality of sensitive amplifiers 312, and the memory array 301 including a plurality of storage units; a CSL; a WL; a read/write switching circuit 300, the read/write switching circuit 300 being connected to the sensitive amplifier array 302, and the read/write switching circuit 300 including a first data line Ldat, a first complementary data line Ldat #, a second data line Gdat and a second complementary data line Gdat #; a row decoding circuit 303; a column decoding circuit 304; and a driving circuit 305. Specifically, the number of the read/write switching circuit 300 may be the same as that of the sensitive amplifier array 302, and each read/write switching circuit 300 is connected to the corresponding sensitive amplifier array 302.

The memory is described below in conjunction with the working mechanism of the memory.

After a WL is selected by the row decoding circuit 303, data in the memory array 301 corresponding to the WL is transmitted to the sensitive amplifier 312, and after being amplified by the sensitive amplifier 312, the data is then written back to the storage unit connected to the selected WL.

When data write is needed, the column decoding circuit 304 selects the corresponding sensitive amplifier 312, data is transmitted from the second data line Gdat and the second complementary data line Gdat #to the first data line Ldat and the first complementary data line Ldat #through the read/write switching circuit 300, and then is written to the corresponding sensitive amplifier 312 and the storage unit connected thereto. During the write, the read/write switching circuit 300 not only plays a role of signal transmission, but also can amplify the first data line Ldat and the first complementary data line Ldat #, which is conducive to the rapid separation of signals of the first data line Ldat and the first complementary data line Ldat #. This not only helps increase the data transmission speed, but also lowers the requirement of the read/write switching circuit 300 on the driving capability of the sensitive amplifier 312, so that the sensitive amplifier 312 with a smaller area can meet the requirements on the driving capability, which greatly reduces the process difficulty of the sensitive amplifier 312, and accords with the development trend of device miniaturization.

A data transmission direction during data read is opposite to that during data write. The column decoding circuit 304 selects the corresponding sensitive amplifier 312, and the data is transmitted to the first data line Ldat and the first complementary data line Ldat #and then transmitted to the second data line Gdat and the second complementary data line Gdat #through the read/write switching circuit 300. Similarly, during data read, the read/write switching circuit 300 can greatly speed up the distinction between the first data line Ldat and the first complementary data line Ldat #, and the data is transmitted faster from the sensitive amplifier 312, the first data line Ldat and the first complementary data line Ldat #to the second data line Gdat and the second complementary data line Gdat #.

It may be understood that only a pair of the second data line and the second complementary data line are illustrated in FIG. 6 and FIG. 7. In actual use, the memory may include a plurality of pairs of second data lines and second complementary data lines. Similarly, in actual use, the memory may include a plurality of pairs of first data lines and first complementary data lines.

The memory may be a DRAM, an SRAM, a MRAM, a FeRAM, a PCRAM, an NAND flash memory, a NOR flash memory or other memories. As can be seen from the foregoing analysis, the memory according to this embodiment has an advantage of fast data transmission and has low requirements on the driving capability of the sense amplifier, which is conducive to meeting the development trend of device miniaturization.

Those of ordinary skill in the art may understand that the above implementations are specific embodiments for implementing the present application. In actual use, various changes may be made thereto in terms of form and detail without departing from the spirit and scope of the present application. Any person skilled in the art can make respective alterations and modifications without departing from the spirit and scope of the present application. Therefore, the protection scope of the present application should be subject to the scope defined by the claims.

What is claimed is:

1. A read/write switching circuit, comprising: a first data line connected to a bit line through a column select module, a first complementary data line connected to a complementary bit line through the column select module, a second data line and a second complementary data line, and further comprising:

a read/write switching module, connected between the first data line and the second data line and connected between the first complementary data line and the second complementary data line, and configured to transmit data between the first data line and the second data line and transmit data between the first complementary data line and the second complementary data line during read and write operations in response to read and write control signals; and an amplification module connected between the first data line and the first complementary data line and configured to amplify data of the first data line and data of the first complementary data line, wherein the read/write switching module comprises: a first read/write unit configured to transmit the data of the first data line to the second data line in response to the read control signal in the read and write control signals, or transmit data of the second data line to the first data line in response to the write control signal in the read and write control signals; and a second read/write unit configured to transmit the data of the first complementary data line to the second complementary data line in response to the read control signal, or transmit data of the second complementary data line to the first complementary data line in response to the write control signal; and wherein the first read/write unit comprises: a third n-channel metal-oxide semiconductor (NMOS) transistor, a fourth NMOS transistor and a fifth NMOS transistor; a gate of the third NMOS transistor receives the write control signal, and the third NMOS transistor is electrically connected to the first data line and the second data line in response to the write control signal; a gate of the fourth NMOS transistor is electrically connected to the first complementary data line, a drain of the fourth NMOS transistor is electrically connected to the second data line, a source of the fourth NMOS transistor is electrically connected to a drain of the fifth NMOS transistor, and a gate of the fifth NMOS transistor receives the read control signal.

2. The read/write switching circuit according to claim 1, wherein the amplification module comprises a first inverter, a first input terminal of the first inverter being electrically connected to the first data line, and a first output terminal of the first inverter being electrically connected to the first complementary data line; and a second inverter, a second input terminal of the second inverter being electrically connected to the first output terminal of the first inverter and the first complementary data line, and a second output terminal of the second inverter being electrically connected to the first input terminal of the first inverter and the first data line.

3. The read/write switching circuit according to claim 2, wherein the first inverter comprises: a first p-channel metal-oxide semiconductor (PMOS) transistor and a first NMOS transistor, a gate of the first PMOS transistor being connected to a gate of the first NMOS transistor and serving as the first input terminal of the first inverter, a source of the first PMOS transistor being connected to an operating power supply, and a drain of the first PMOS transistor being connected to a drain of the first NMOS transistor and serving as the first output terminal of the first inverter.

4. The read/write switching circuit according to claim 3, wherein the second inverter comprises: a second PMOS transistor and a second NMOS transistor, a gate of the second PMOS transistor being connected to a gate of the second NMOS transistor and serving as the second input terminal of the second inverter, a source of the second PMOS transistor being connected to the operating power supply, and a drain of the second PMOS transistor being connected to a drain of the second NMOS transistor and serving as the second output terminal of the second inverter.

5. The read/write switching circuit according to claim 4, wherein the read/write switching circuit further comprises: a sixth NMOS transistor, a gate of the sixth NMOS transistor receiving an enable signal, a drain of the sixth NMOS transistor being connected to the first inverter and the second inverter and being further electrically connected to a source of the fifth NMOS transistor, and a source of the sixth NMOS transistor being grounded.

6. The read/write switching circuit according to claim 4, wherein a source of the first NMOS transistor is grounded, and a source of the second NMOS transistor is grounded.

7. The read/write switching circuit according to claim 4, wherein the amplification module further comprises: an enable NMOS transistor, a drain of the enable NMOS transistor being electrically connected to the first inverter and the second inverter, a gate of the enable NMOS transistor receiving an enable signal, and a source of the enable NMOS transistor being grounded.

8. The read/write switching circuit according to claim 6, wherein the read/write switching module comprises: a read unit configured to transmit the data of the first data line to the second data line and transmit the data of the first complementary data line to the second complementary data line in response to the read control signal in the read and write control signals; and a write unit configured to transmit the data of the second data line to the first data line and transmit the data of the second complementary data line to the first complementary data line in response to the write control signal in the read and write control signals.

9. The read/write switching circuit according to claim 1, further comprising: a pre-charging module, the pre-charging module being connected between the first data line and the first complementary data line and configured to pre-charge the first data line and the first complementary data line in response to a pre-charging control signal.

10. The read/write switching circuit according to claim 9, wherein the pre-charging module comprises: a third p-channel metal-oxide semiconductor (PMOS) transistor, a fourth PMOS transistor and a fifth PMOS transistor, a gate of the third PMOS transistor, a gate of the fourth PMOS transistor and a gate of the fifth PMOS transistor receiving the pre-charging control signal; and
a source of the third PMOS transistor and a source of the fourth PMOS transistor being connected to an operating power supply, and a drain of the third PMOS transistor being electrically connected to the first data line; a drain of the fourth PMOS transistor being electrically connected to the first complementary data line; and the fifth PMOS transistor being electrically connected to the first data line and the first complementary data line in response to the pre-charging control signal.

11. A memory, comprising the read/write switching circuit according to claim 1.

12. The memory according to claim 11, wherein the memory further comprises: a plurality of storage modules, each storage module of the plurality of storage modules comprising a memory array and a sensitive amplifier array; and the read/write switching circuit being connected to the sensitive amplifier array.

13. The memory according to claim 11, wherein the memory comprises a dynamic random access memory (DRAM), a static random-access memory (SRAM), a magnetoresistive random access memory (MRAM), a ferroelectric RAM (FeRAM), a phase change RAM (PCRAM), an NAND flash memory or a NOR flash memory.

14. A read/write switching circuit, comprising: a first data line connected to a bit line through a column select module, a first complementary data line connected to a complementary bit line through the column select module, a second data line and a second complementary data line, and further comprising:
a read/write switching module, connected between the first data line and the second data line and connected between the first complementary data line and the second complementary data line, and configured to transmit data between the first data line and the second data line and transmit data between the first complementary data line and the second complementary data line during read and write operations in response to read and write control signals; and
an amplification module connected between the first data line and the first complementary data line and configured to amplify data of the first data line and data of the first complementary data line,
wherein the read/write switching module comprises: a first read/write unit configured to transmit the data of the first data line to the second data line in response to the read control signal in the read and write control signals, or transmit data of the second data line to the first data line in response to the write control signal in the read and write control signals; and a second read/write unit configured to transmit the data of the first complementary data line to the second complementary data line in response to the read control signal, or transmit data of the second complementary data line to the first complementary data line in response to the write control signal; and
wherein the second read/write unit comprises: a seventh n-channel metal-oxide semiconductor (NMOS) transistor, an eighth NMOS transistor and a ninth NMOS transistor; a gate of the seventh NMOS transistor receives the write control signal, and the seventh NMOS transistor is electrically connected to the first complementary data line and the second complementary data line in response to the write control signal; a gate of the eighth NMOS transistor is electrically connected to the first data line, a drain of the eighth NMOS transistor is electrically connected to the second complementary data line, a source of the eighth NMOS transistor is electrically connected to a drain of the ninth NMOS transistor, and a gate of the ninth NMOS transistor receives the read control signal.

15. A read/write switching circuit, comprising: a first data line connected to a bit line through a column select module, a first complementary data line connected to a complementary bit line through the column select module, a second data line and a second complementary data line, and further comprising:
   a read/write switching module, connected between the first data line and the second data line and connected between the first complementary data line and the second complementary data line, and configured to transmit data between the first data line and the second data line and transmit data between the first complementary data line and the second complementary data line during read and write operations in response to read and write control signals; and
   an amplification module connected between the first data line and the first complementary data line and configured to amplify data of the first data line and data of the first complementary data line,
   wherein the read/write switching module comprises: a read unit configured to transmit the data of the first data line to the second data line and transmit the data of the first complementary data line to the second complementary data line in response to the read control signal in the read and write control signals; and a write unit configured to transmit data of the second data line to the first data line and transmit data of the second complementary data line to the first complementary data line in response to the write control signal in the read and write control signals; and
   wherein the write unit comprises: a sixth n-channel metal-oxide semiconductor (NMOS) transistor, a seventh NMOS transistor and an eighth NMOS transistor; and a gate of the eighth NMOS transistor and a gate of the sixth NMOS transistor receive the write control signal, the eighth NMOS transistor is electrically connected to the first data line and the second data line in response to the write control signal, a gate of the seventh NMOS transistor is electrically connected to the second data line, a drain of the seventh NMOS transistor is electrically connected to the first complementary data line, a source of the seventh NMOS transistor is electrically connected to a drain of the sixth NMOS transistor, and a source of the sixth NMOS transistor is grounded.

16. The read/write switching circuit according to claim 15, wherein the write unit further comprises: a third NMOS transistor, a fourth NMOS transistor and a fifth NMOS transistor; and gates of the third NMOS transistor and the fifth NMOS transistor receive the write control signal, the third NMOS transistor is electrically connected to the first complementary data line and the second complementary data line in response to the write control signal, a gate of the fourth NMOS transistor is electrically connected to the second complementary data line, a drain of the fourth NMOS transistor is electrically connected to the first data line, a source of the fourth NMOS transistor is electrically connected to a drain of the fifth NMOS transistor, and a source of the fifth NMOS transistor is grounded.

17. The read/write switching circuit according to claim 15, wherein the read unit comprises: a tenth NMOS transistor and a twelfth NMOS transistor; a gate of the twelfth NMOS transistor receives the read control signal; and a drain of the twelfth NMOS transistor is electrically connected to the second data line, a source of the twelfth NMOS transistor is electrically connected to a drain of the tenth NMOS transistor, a gate of the tenth NMOS transistor is electrically connected to the first complementary data line, and a source of the tenth NMOS transistor is grounded.

18. The read/write switching circuit according to claim 17, wherein the read unit further comprises: a ninth NMOS transistor and an eleventh NMOS transistor; the ninth NMOS transistor has a gate electrically connected to the first data line, a source grounded and a drain electrically connected to a source of the eleventh NMOS transistor; and a gate of the eleventh NMOS transistor receives the read control signal, and a drain of the eleventh NMOS transistor is electrically connected to the second complementary data line.

* * * * *